US012601041B2

(12) United States Patent
Guo et al.

(10) Patent No.: US 12,601,041 B2
(45) Date of Patent: Apr. 14, 2026

(54) MASK, MASK STRUCTURE AND METHOD FOR MANUFACTURING MASK

(71) Applicants:Chengdu BOE Optoelectronics Technology Co., Ltd., Chengdu (CN); BOE Technology Group Co., Ltd., Beijing (CN)

(72) Inventors: Dengjun Guo, Beijing (CN); Junji Zhou, Beijing (CN); Bowen Yang, Beijing (CN); Wenchang Zhang, Beijing (CN); Chao Ma, Beijing (CN); Qingfeng Wu, Beijing (CN); Xiaolong Luo, Beijing (CN); Zhilin Du, Beijing (CN); Yingdong Shi, Beijing (CN); Shuowen Yi, Beijing (CN); Wenxu Lv, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 878 days.

(21) Appl. No.: 17/780,714

(22) PCT Filed: May 12, 2021

(86) PCT No.: PCT/CN2021/093381
§ 371 (c)(1),
(2) Date: May 27, 2022

(87) PCT Pub. No.: WO2021/258891
PCT Pub. Date: Dec. 30, 2021

(65) Prior Publication Data
US 2023/0357913 A1    Nov. 9, 2023

(30) Foreign Application Priority Data
Jun. 24, 2020    (CN) .......................... 202010588550.5

(51) Int. Cl.
*C23C 14/04* (2006.01)
*C23C 14/24* (2006.01)

(52) U.S. Cl.
CPC ............ *C23C 14/042* (2013.01); *C23C 14/24* (2013.01)

(58) Field of Classification Search
None
See application file for complete search history.

(56) References Cited

U.S. PATENT DOCUMENTS 9,376,743 B2 *    6/2016    Lee ........................ C23C 14/042
10,283,713 B2 *    5/2019    Lee ........................ H10K 50/84
(Continued)

FOREIGN PATENT DOCUMENTS

CN    106480404 A    3/2017
CN    206033864 U *    3/2017    ............. C23C 14/04
(Continued)

OTHER PUBLICATIONS

Written Opinion of the International Application from the International Application No. PCT/CN2021/093381 dated Aug. 4, 2021, 5 pages. (Year: 2021).*
(Continued)

*Primary Examiner* — Jethro M. Pence
(74) *Attorney, Agent, or Firm* — IPro, PLLC

(57) ABSTRACT
Provided is a mask, which includes: a mask body, including a plurality of grooves, wherein the plurality of grooves are distributed at intervals on a first surface of the mask body, and a hollowed-out structure is provided in the groove; and a mask strip disposed on the mask body, wherein a pattern region of the mask strip is within an orthographic projection of the groove on the first surface.

18 Claims, 17 Drawing Sheets

(56)        References Cited

U.S. PATENT DOCUMENTS

| | | | |
|---|---|---|---|
| 10,465,277 B2 * | 11/2019 | Xu | C23C 14/24 |
| 11,800,780 B2 * | 10/2023 | Ji | C23C 14/12 |
| 2012/0266813 A1 * | 10/2012 | Hong | H10K 71/166 |
| | | | 118/504 |
| 2014/0150721 A1 * | 6/2014 | Oh | C23C 14/042 |
| | | | 118/504 |
| 2018/0239241 A1 * | 8/2018 | Lv | G03F 7/12 |
| 2019/0233931 A1 | 8/2019 | Zhang et al. | |
| 2021/0123129 A1 * | 4/2021 | Zheng | C25D 3/58 |
| 2021/0164087 A1 | 6/2021 | Lin et al. | |
| 2021/0214836 A1 * | 7/2021 | Ji | C23C 14/042 |

FOREIGN PATENT DOCUMENTS

| | | |
|---|---|---|
| CN | 206279261 U | 6/2017 |
| CN | 108251796 A | 7/2018 |
| CN | 109023238 A | 12/2018 |
| CN | 110029307 A | 7/2019 |
| CN | 111676446 A | 9/2020 |
| JP | 2000323379 A | 11/2000 |

OTHER PUBLICATIONS

CN202010588550.5 first office action.
CN202010588550.5 second office action.

* cited by examiner

A-A

B-B

C-C

D-D

E-E

<u>20</u>

W b

L5 a

201

202

L3

L4 b

L1

L2

201

30

202

20 c

H

H

W

H-H

L5

L6

201

30

20

202 a

Forming a plurality of grooves on a first surface of a metal plate — S31

Manufacturing hollowed-out structures in the grooves — S32

201

6

I-I

30

W

201

20

202

10

101

MASK, MASK STRUCTURE AND METHOD FOR MANUFACTURING MASK

CROSS-REFERENCE TO RELATED APPLICATION

The present disclosure is a U.S. national stage of international application No. PCT/CN2021/093381, filed on May 12, 2021, which claims priority to Chinese Patent Application No. 202010588550.5, filed on Jun. 24, 2020, and entitled "MASK, MASK STRUCTURE, AND METHOD FOR MANUFACTURING MASK", the entire content of which is incorporated herein by reference.

TECHNICAL FIELD

The present disclosure relates to the field of evaporation, and in particular relates to a mask, a mask structure, and a method for manufacturing a mask.

BACKGROUND

At present, metal masks are widely used in manufacture of organic light-emitting diode (OLED) display panels.

In the process of manufacturing an OLED display panel, a metal mask is used to shield a surface of a substrate, and an evaporation process is adopted to process coating materials, so that the coating materials pass through hollowed-out portions of the metal mask and are deposited on the surface of the substrate, thereby acquiring a patterned film layer, that is, an OLED device is formed on the substrate by evaporation.

SUMMARY

Embodiments of the present disclosure provide a mask, a mask structure, and a method for manufacturing a mask. The technical solutions are as follows.

In an aspect of the present disclosure, a mask is provided. The mask includes:

a mask body, including a plurality of grooves, wherein the plurality of grooves are distributed at intervals on a first surface of the mask body, and a hollowed-out structure is provided in the groove; and a mask strip disposed on the mask body, wherein a pattern region of the mask strip is within an orthographic projection of the groove on the first surface.

In an implementation of the embodiments of the present disclosure, a width of the groove is greater than a width of the mask strip.

In an implementation of the embodiments of the present disclosure, a difference value between the width of the groove and the width of the mask strip ranges from 1 μm to 5 μm.

In an implementation of the embodiments of the present disclosure, a length of the groove is smaller than a length of the mask strip.

In an implementation of the embodiments of the present disclosure, a difference value between the length of the groove and the length of the mask strips ranges from 1 μm to 5 μm.

In an implementation of the embodiments of the present disclosure, in a direction perpendicular to the first surface, a depth of the groove is greater than a thickness of the mask strip.

In an implementation of the embodiments of the present disclosure, a difference value between the depth of the groove and the thickness of the mask strip ranges from 5 μm to 15 μm.

In an implementation of the embodiments of the present disclosure, the hollowed-out structure has a rectangular opening area, wherein a length of the rectangular opening area ranges from 150 mm to 160 mm and a width of the rectangular opening area ranges from 70 mm to 80 mm.

In an implementation of the embodiments of the present disclosure, one hollowed-out structure is provided in one groove.

In an implementation of the embodiments of the present disclosure, two hollowed-out structures are provided in one groove.

In an implementation of the embodiments of the present disclosure, the mask body is an iron-nickel alloy mask body or a stainless steel mask body.

In another aspect of the embodiments of the present disclosure, a mask structure is provided. The mask structure includes:

a mask frame, provided with an opening; and the mask described in any implementation of the above aspect, wherein the mask is disposed on the mask frame.

In still another aspect of the embodiments of the present disclosure, a method for manufacturing a mask is provided. The method includes:

forming a plurality of grooves and a plurality of hollowed-out structures on a first surface of a metal plate to acquire a mask body, wherein the hollowed-out structure is provided in each of the grooves; and welding a mask strip to the mask body, wherein a pattern region of the mask strip is within an orthographic projection of the groove on the first surface.

In an implementation of the embodiments of the present disclosure, forming the plurality of grooves and the plurality of hollowed-out structures on the first surface of the metal plate includes:

forming the plurality of hollowed-out structures on the first surface of the metal plate; and forming a step at an edge of each of the hollowed-out structure to acquire the plurality of grooves.

In an implementation of the embodiments of the present disclosure, forming the plurality of grooves and the plurality of hollowed-out structures on the first surface of the metal plate includes:

forming the plurality of grooves on the first surface of the metal plate; and manufacturing the hollowed-out structures in the grooves.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

Figure 1:
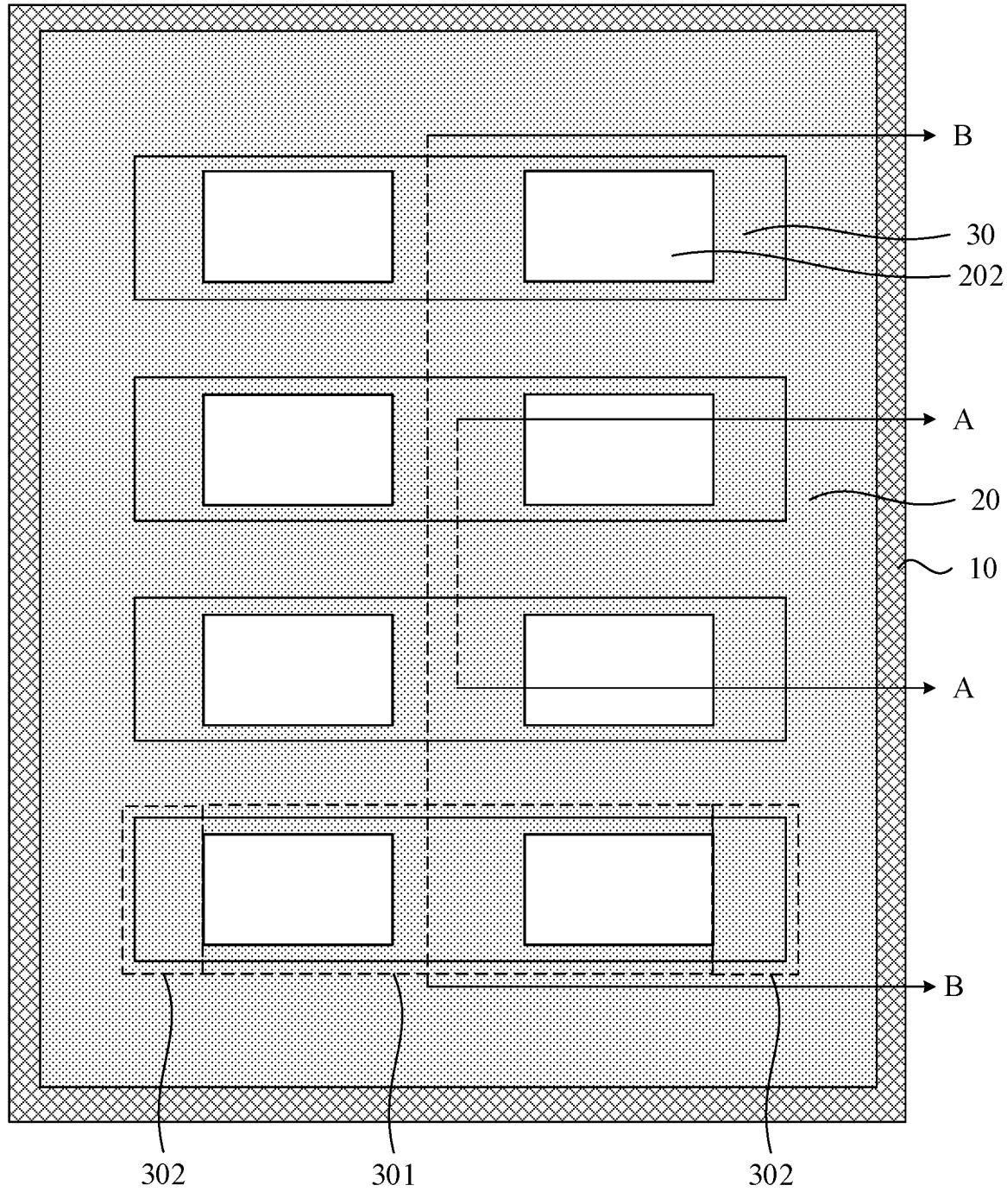
FIG. 1 shows a top view of a mask structure in the related art.

FIG. 1 shows a top view of a mask structure in the related art. Referring to FIG. 1, a mask includes a mask frame 10, a mask body 20, and mask strips 30. The mask body 20 is disposed on the mask frame 10, and the mask strips 30 are disposed on the mask body 20. An opening (not shown in FIG. 1) is formed in a middle portion of the mask frame 10, the mask body 20 is provided with a hollowed-out structure (not shown in FIG. 1), and the mask strip 30 is provided with a plurality of evaporation holes (i.e., a meshed mask strip is formed). The opening, the hollowed-out structure and the evaporation holes are communicated with each other. During evaporation, a substrate is placed above a mask structure, and the mask strips 30 are disposed opposite to the substrate, so that an evaporation material passes through the opening, the hollowed-out structure, and the evaporation holes sequentially, and is deposited on a surface of the substrate.

Figure 2:
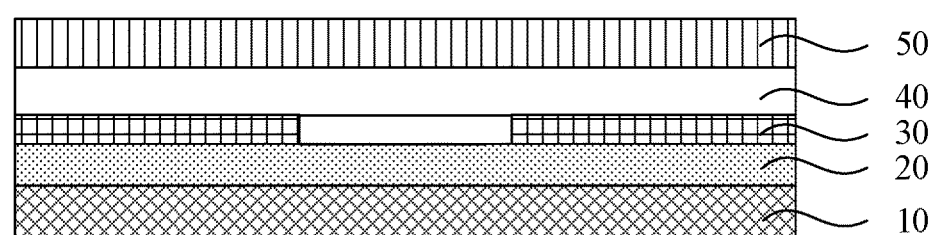
FIG. 2 is a schematic sectional view along the line A-A in FIG. 1 after mask strips and a substrate are attached to each other.

FIG. 2 is a schematic sectional view along the line A-A in FIG. 1 after mask strips and a substrate are attached to each other. Referring to FIG. 2, the substrate 40 is disposed on the mask strips 30. During evaporation, a magnetic partition plate 50 may be placed on the substrate 40. The magnetic partition plate 50 has a magnetic force, which exerts a magnetic attraction force on the mask structure, so that the substrate 40 is fixed between the mask structure and the magnetic partition plate 50. The substrate 40 or the mask structure is prevented from moving during evaporation, thereby ensuring the accuracy of evaporation.

Figure 3:
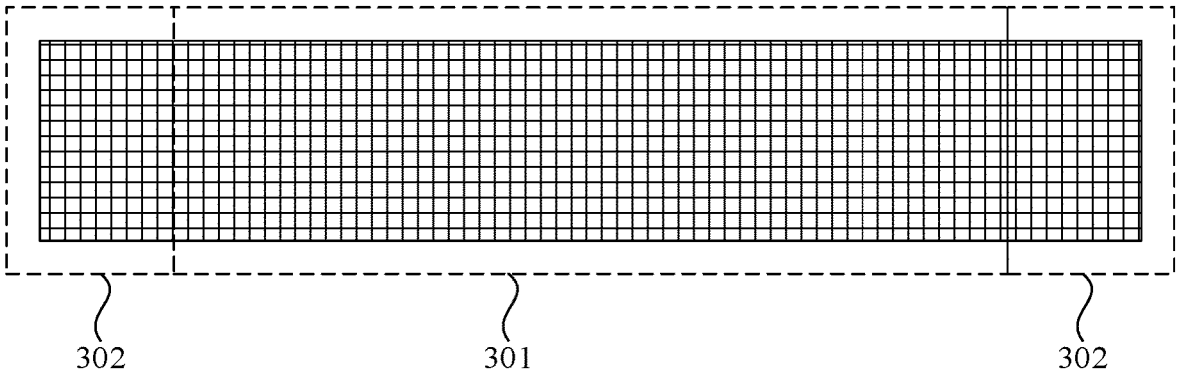
FIG. 3 is a schematic structural diagram of a mask strip according to an embodiment of the present disclosure.
Figure 4:
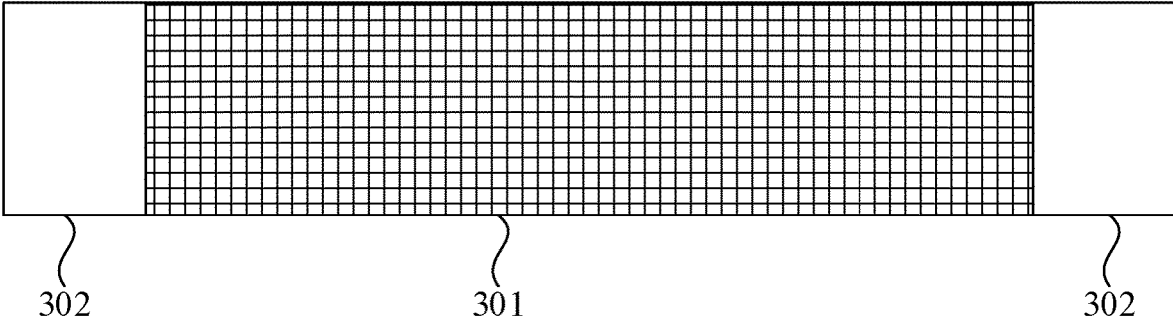
FIG. 4 is a schematic structural diagram of a mask strip according to an embodiment of the present disclosure.

FIGS. 3 and 4 are schematic structural diagrams of a mask strip according to embodiments of the present disclosure. Referring to FIGS. 3 and 4, the mask strip 30 includes a welding region 302, a pattern region 301, and a welding region 302 which are connected sequentially. The welding regions 302 are at two ends of the mask strip 30 for being welded to the mask body 20, and the pattern region 301 is in the middle of the mask strip and is provided with a plurality of hollowed-out holes. The pattern region 301 is a region where pixels are to be formed in the mask strip 30.

The mask strip 30 is also referred to as a fine metal mask (FMM).

The pattern region 301 and the welding regions 302 of the mask strip 30 shown in FIG. 3 are all meshed, that is, the pattern region 301 and the welding regions 302 are the same in structure. The pattern region 301 of the mask strip 30 shown in FIG. 4 is meshed, and the welding regions 302 are non-meshed, that is, no hollowed-out hole is formed in the welding regions 302. The pattern region 301 and the welding regions 302 are different in structure. The mask strip shown in FIG. 3 is take as an example for illustrative introduction below.

In the process of evaporation, a clamping hand is used to clamp two ends of the substrate, and the substrate is lowered to make the substrate disposed above the mask structure. The substrate is a flexible substrate. After the two ends of the substrate are clamped with the clamping hand, a middle region of the substrate is protruded towards the mask structure due to the action of gravity, and a protruded portion of the substrate is in contact with the mask strip first. A friction force exists between the substrate and the mask strip that are in contact with each other, and the mask strip is disposed between the mask body and the substrate, so that the friction force between the substrate and the mask strip is relatively big. In the process of continuously lowering the substrate, a middle portion of the mask strip is not fixed on the mask body, and the middle portion of the mask strip may move under the action of the friction force, resulting in bending of the mask strip. Thus, the position of the pattern region of the mask strip changes, which may affect the accuracy of a pixel region formed by evaporation.

Figure 5:
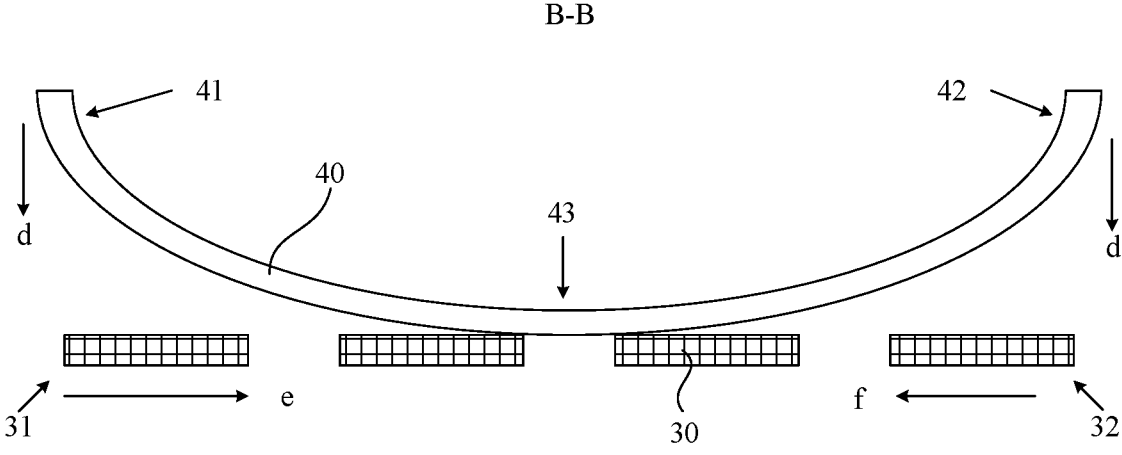
FIG. 5 shows a schematic diagram illustrating a bending principle of a mask strip.

FIG. 5 shows a schematic diagram illustrating the bending principle of a mask strip. FIG. 5 is a schematic sectional view along the line A-A in FIG. 1 when the mask strip and a substrate are attached to each other. Referring to FIG. 5, when the substrate 40 and the mask strip 30 are attached, the clamping hand is used to clamp the two ends (marked as 41 and 42 in FIG. 5) of the substrate 40). The substrate 40 is generally a flexible substrate (for example, a low temperature poly-silicon (LTPS) substrate), and a middle portion 43 of the substrate 40 may be protruded towards the mask strip 30 under the action of gravity, thereby forming a bending substrate 40. The middle portion 43 of the substrate 40 is in contact with the mask strip 30 first, and a friction force exists between the substrate 40 and the mask strip 30 that are in contact with each other. In the process of continuously lowering the two ends (41 and 42) of the substrate 40, i.e., in the process that the two ends (41 and 42) of the substrate 40 move down along the direction d shown in FIG. 5, two ends (marked as 31 and 32 in FIG. 5) of the mask strip 30 move towards the middle due to the action of the friction force, that is, one end 31 of the mask strip 30 in FIG. 5 moves along the direction e, and the other end 32 of the mask strip 30 in FIG. 5 moves along the direction f, resulting in bending of the mask strip 30. Thus, the position of the pattern region 301 of the mask strip 30 changes.

Figure 6:
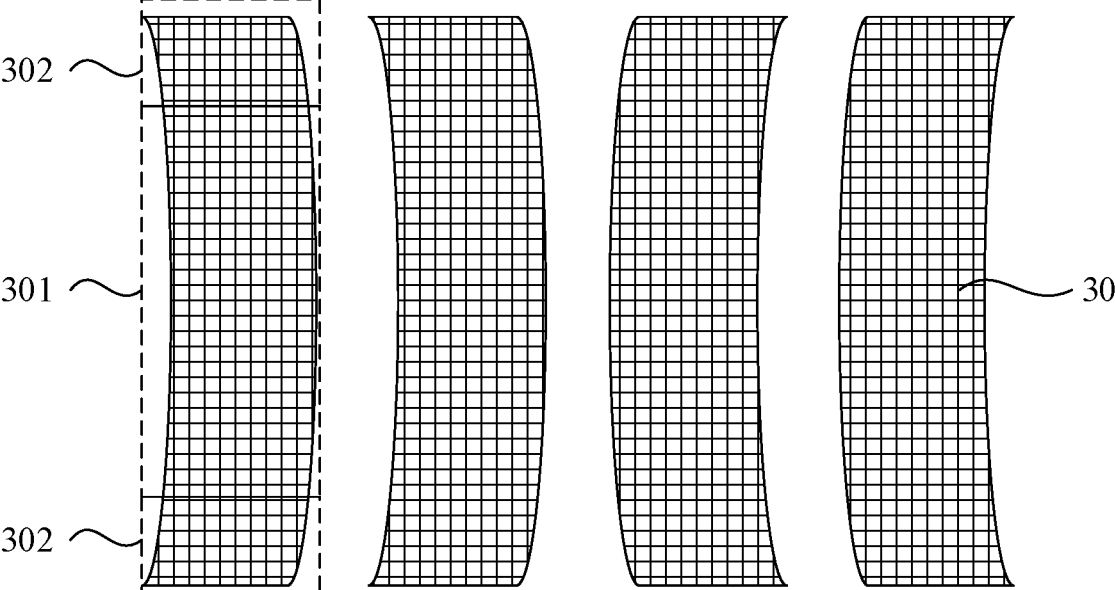
FIG. 6 shows a top view of mask strips after a substrate and the mask strips are attached to each other in the related art.

FIG. 6 shows a top view of mask strips after a substrate and the mask strips are attached to each other in the related art. Referring to FIG. 6, after the substrate 40 and the mask strips 30 are attached to each other, the mask strips 30 on the left side bend towards the right, and the mask strips 30 on the right side bend towards the left, so that the positions of the pattern regions 301 change.

Organic light-emitting layers are evaporated layer by layer. Generally, a blue pixel light-emitting layer is evaporated first; then, a red pixel auxiliary layer is evaporated; next, a red pixel light-emitting layer is evaporated; next, a green pixel auxiliary layer is evaporated; and then, a green pixel light-emitting layer is evaporated, to form a red, green, blue light-emitting device. The red pixel auxiliary layer is disposed on the side, close to the substrate, of the red pixel light-emitting layer, and is configured to conduct light when red pixels emit light. The green pixel auxiliary layer is disposed on the side, close to the substrate, of the green pixel light-emitting layer, and is configured to conduct light when green pixels emit light. Due to the material of the blue pixel, the blue pixel does not need an auxiliary pixel to conduct light when emitting light, and thus there is no need to manufacture a blue pixel auxiliary layer.

A photo spacer (PS) is provided on the substrate 40. The photo spacer is disposed between adjacent pixels and configured to support the mask strips 30 during evaporation, so as to prevent the mask strips 30 from being in a direct contact with an evaporated film layer, thereby avoiding friction. The thickness of the photo spacer ranges from 1 μm to 10 μm (for example, 2 μm). However, since the substrate 40 is a flexible substrate, the substrate 40 may bend, such that the mask strips 30 may be in contact with the evaporated film layer in the process of attaching the substrate to the mask strips.

In the related art, since the substrate 40 is in contact with the mask strips 30, the substrate 40) drives the mask strips 30 to move in the process that the substrate 40 is lowered down. The boundaries of the mask strips 30 may scrape materials from the manufactured film layer during movement of the mask strips 30, and the scraped materials may fall into the region where the photo spacer is disposed, thereby forming PS foreign matter. In addition, the movement of the pattern region 301 may also result in change of the position of the pixel region, that is, may affect the pixel position accuracy (PPA), and may also evaporate materials of the pixel regions that are evaporated later onto manufactured pixel regions of other colors, resulting in color mixing in the pixel regions and affecting the product yield.

Figures 7, 8:
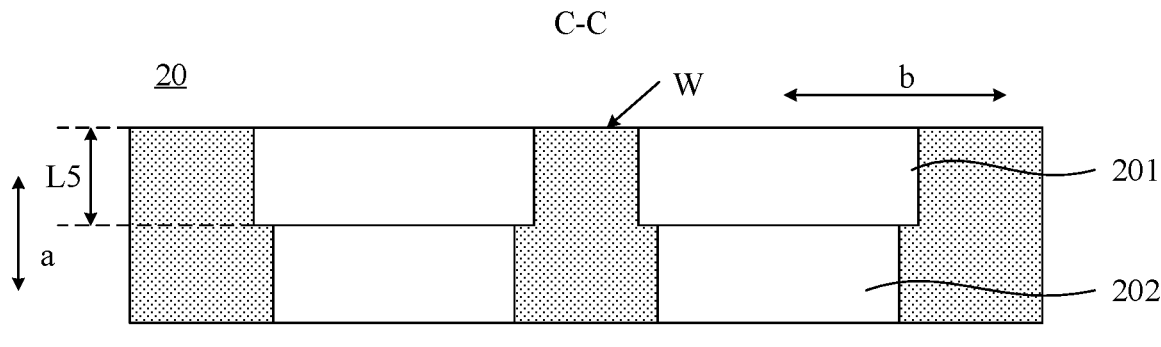
FIG. 7 is a top view of a mask body according to an embodiment of the present disclosure.
FIG. 8 is a schematic sectional view along the line C-C in FIG. 7.

FIG. 7 is a top view of a mask body according to an embodiment of the present disclosure. Referring to FIG. 7, the mask includes a mask body 20. The mask body 20 includes a plurality of grooves 201 and a plurality of hollowed-out structures 202. One hollowed-out structure 202 is provided in one groove 201.

FIG. 8 is a schematic sectional view along the line C-C in FIG. 7. Referring to FIGS. 7 and 8, the mask body 20 has a first surface W, and the plurality of grooves 201 are distributed on the first surface W at intervals.

Figure 9:
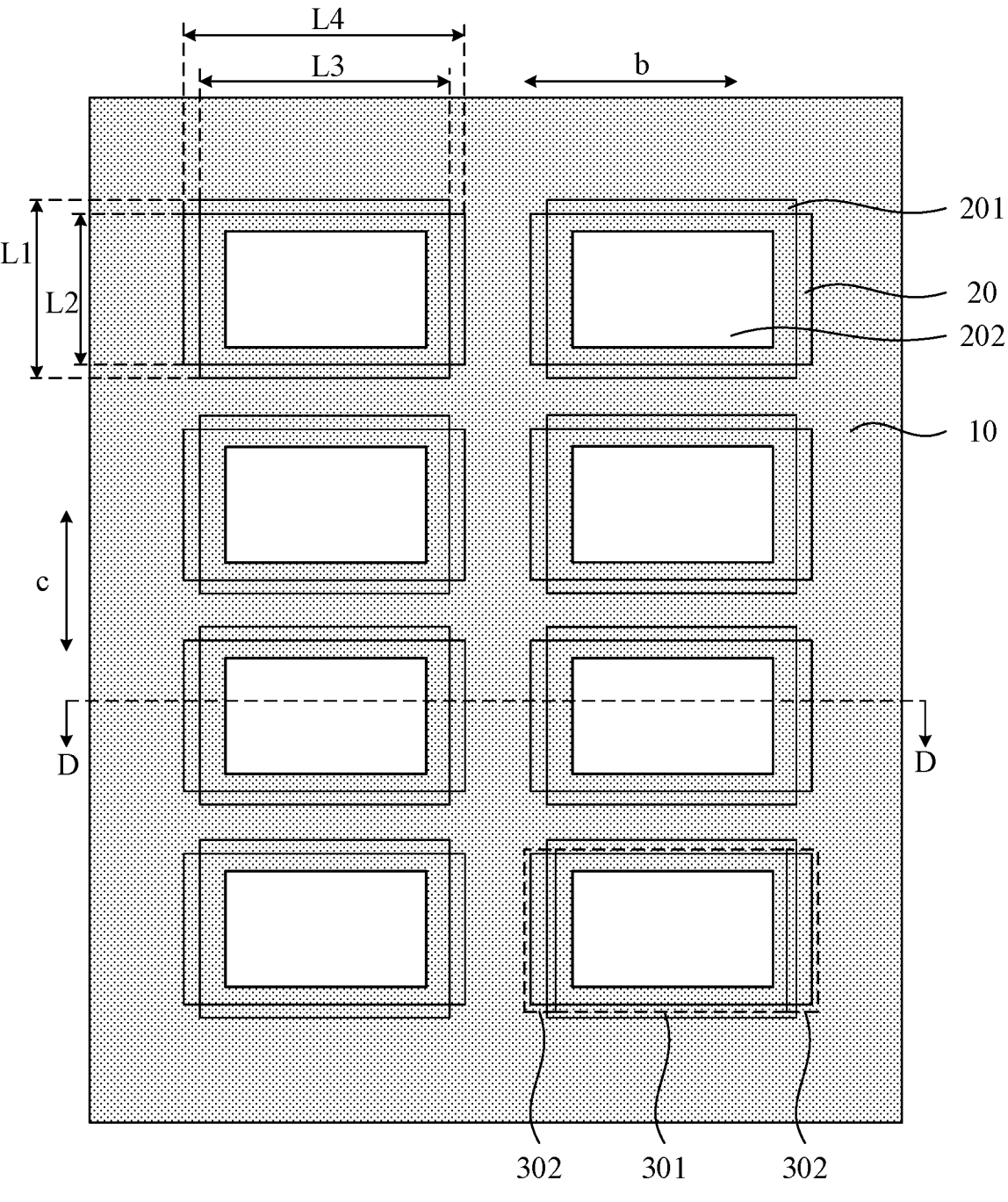
FIG. 9 is a top view of a mask according to an embodiment of the present disclosure.
Figure 10:
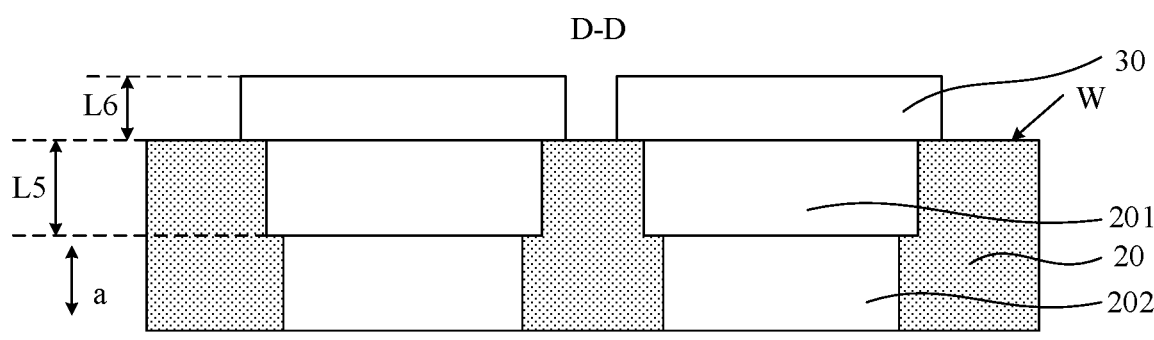
FIG. 10 is a schematic sectional view along the line D-D in FIG. 9.

FIG. 9 is a top view of a mask according to an embodiment of the present disclosure. FIG. 9 is a top view after the mask strips are mounted on the mask body shown in FIG. 7. FIG. 10 is a schematic sectional view along the line D-D in FIG. 9. Referring to FIGS. 9 and 10, the mask further includes the mask strips 30, and the mask strips 30 are mounted on the mask body 20. The pattern region 301 of the mask strip 30 is within the orthographic projection of the groove 201 on the first surface W.

In this implementation, the grooves 201 are formed in the mask body 20, and the pattern region 301 of the mask strip 30 is within the orthographic projection of the groove 201 on the first surface W, that is, the groove 201 is configured to accommodate the middle portion of the mask strip 30. In the process of attaching the substrate to the mask strips, when the substrate 40 is placed above the mask strips 30, the substrate 40 exerts on the mask strips 30 a force towards the mask body 20, so that the middle portion of the mask strip 30 moves towards the inside of the groove 201, and the middle portion of the mask strip 30 is not in contact with the substrate 40, that is, there is no friction force between the middle portion of the mask strip 30 and the substrate 40. In the process of lowering the substrate 40, since there is no friction force between the middle portion of the mask strip 30 and the substrate, the movement of the pattern region 301 of the mask strip 30 is reduced. Therefore, the bending degree of the mask strip 30 is reduced and the accuracy of the pixel regions formed by evaporation is improved.

Additionally, as the movement amount of the mask strips 30 is reduced, the evaporated film layer is less scratched, so that fewer evaporation materials are scraped, and the PS foreign matter is reduced. Moreover, the color mixing in the pixel regions is reduced, which ensures the product yield.

As shown in FIGS. 7 to 10, only one hollowed-out structure 202 is provided in one groove 201. In this case, one mask strip 30 covers one hollowed-out structure 202.

As shown in FIG. 9, the width L1 of the groove 201 is greater than the width L2 of the mask strip 30.

In this implementation, the width L1 of the groove 201 is larger. On the one hand, mounting of the mask strips 30 is facilitated. On the other hand, it's ensured that when the mask strips 30 are mounted on the mask body 20, the pattern region 301 of the mask strip 30 can be completely within the orthographic projection of the groove 201 on the first surface W. In this way, the middle portion of the mask strip 30 may be completely placed in the groove 201 during evaporation, so that the middle portion of the mask strip 30 is not in contact with the substrate. Additionally, the groove 201 can limit the movement of the mask strip 30 in a width direction, which can reduce the movement of the pattern region 301 as well and improve the accuracy of the pixels formed by evaporation.

In an implementation of the embodiments of the present disclosure, a difference value between the width L1 of the groove 201 and the width L2 of the mask strip 30 ranges from 1 μm to 5 μm.

In the embodiments of the present disclosure, the width L1 of the groove 201 is slightly greater than the width L2 of the mask strip 30 by limiting the difference between the width L1 of the groove 201 and the width L2 of the mask strip 30, which can not only facilitate alignment between the mask strip 30 with the groove 201 to enable the pattern region 301 of the mask strip 30 to enter into the groove 201, but also prevent the too large width L1 of the groove 201 from affecting the strength of the mask body 20.

Exemplarily, the difference value between the width L1 of the groove 201 and the width L2 of the mask strip 30 mounted on the mask body 20 is 3 μm.

In other implementations, the width L1 of the groove 201 may be equal to the width L2 of the mask strip 30, and the groove 201 can also accommodate the middle portion of the mask strip 30.

As shown in FIG. 9, the length L3 of the groove 201 is smaller than the length L4 of the mask strip 30.

In this implementation, the length L3 of the groove 201 is smaller than the length L4 of the mask strip 30, which facilitates mounting of the mask strips 30 on the mask body 20, that is, the mask strip is mounted on the first surface W of the mask body 20 through the welding regions 302 at the two ends of the mask strip 30.

In an implementation of the embodiments of the present disclosure, a difference value between the length L3 of the groove 201 and the length L4 of the mask strip 30 ranges from 1 μm to 5 μm.

In the embodiments of the present disclosure, the difference between the length L3 of the groove 201 and the length L4 of the mask strip 30 is limited, to prevent a too large length L3 of the groove 201 from affecting the strength of the mask body 20.

Exemplarily, the difference value between the length L3 of the groove 201 and the length L4 of the mask strip 30 mounted on the mask body 20 is 3 μm.

As shown in FIG. 9, the grooves 201 are rectangular grooves. In other implementations, a cross section of the groove 201 may be of other shapes, for example a circle or other irregular polygons, as long as it's ensured that the middle portion of the mask strip 30 is not in contact with the mask body 20, which is not limited in the present disclosure.

Optionally, in the embodiments of the present disclosure, the size of the mask strip 30 is determined first, and the size of the groove 201 is determined next based on the size of the mask strip 30, and the width of the groove 201 is greater than the width of the mask strip 30.

As shown in FIG. 9, the pattern region 301 of the mask strip 30 is within the orthographic projection of the opening of the groove 201 on the first surface W.

Referring to FIG. 10, in the direction a perpendicular to the first surface W, the depth L5 of the groove 201 is greater than the thickness L6 of the mask strip 30. The thickness L6 of the mask strip 30 is the distance between two opposite surfaces of the mask strip 30 disposed on the mask body 20 in the direction a perpendicular to the first surface W.

In the embodiments of the present disclosure, since the depth L5 of the groove 201 is greater than the thickness L6 of the mask strip 30, in the process of attaching the substrate to the mask strips, the substrate squeezes the middle portion of the mask strip 30, so that the middle portion of the mask strip 30 moves towards the inside of the groove 201. Since the width L5 of the groove 201 is greater than the thickness L6 of the mask strip 30, the height of the middle portion of the mask strip 30 may be lower than the height of the mask body 20, so that the middle portion of the mask strip 30 is not in contact with the substrate 40, which can reduce the movement of the mask strip 30, thereby reducing the movement of the pattern region 301 and ensuring the accuracy of patterns formed by evaporation.

In the embodiments of the present disclosure, in the process of attaching the substrate 40 to the mask strips 30, the middle portion of the mask strip 30 may move towards the inside of the grooves 201, and the maximum distance that the middle portion of the mask strip 30 moves towards the inside of the groove 201 in the direction a perpendicular to the first surface W may be greater than, equal to or smaller than the depth L5 of the groove 201. That is, in the direction a perpendicular to the first surface W, the lowest point of the mask strip 30 may be above, flush with or below a bottom surface of the groove 201.

Upon completion of the attaching, in the process of evaporation, the mask strips 30 and the substrate 40) are attached to each other due to the attraction force exerted by the magnetic partition plate 50 on the mask strips 30. In this process, the mask strip 30 only moves in the direction a perpendicular to the first surface W, without affecting the position of the pattern region 301, that is, without affecting the accuracy of the pixel regions formed by evaporation.

In an implementation of the embodiments of the present disclosure, the difference value between the depth L5 of the groove 201 and the thickness L6 of the mask strip 30 ranges from 5 μm to 15 μm.

In the embodiments of the present disclosure, the difference value between the depth L5 of the groove 201 and the thickness L6 of the mask strip 30 is limited. On the one hand, the depth L5 of the groove 201 is ensured so that after the middle portion of the mask strip 30 moves towards the inside of the groove 201, there is a certain distance between the surface of the middle portion of the mask strip 30 and the surface of the mask body 20, which can avoid the movement of the mask strip 30 caused by the substrate 40. On the other hand, the strength of the mask body 20 is prevented from being affected due to a too large depth L5 of the groove 201.

Additionally, a step is formed between the groove 201 and the hollowed-out structure 202, and the step may prevent the middle portion of the mask strip 30 from moving down too far.

Exemplarily, the difference value between the depth L5 of the groove 201 and the thickness L6 of the mask strip 30 is 7 μm.

In other implementations, the difference value between the depth L5 of the groove 201 may be equal to the thickness L6 of the mask strip 30.

Optionally, in the embodiments of the present disclosure, the thickness L6 of the mask strip 30 ranges from 27 μm to 35 μm, and the depth L5 of the groove 201 ranges from 35 μm to 40 μm.

In the embodiments of the present disclosure, the depth of the groove 201 is smaller than the thickness of the mask body 20, and the region where the grooves 201 are disposed may also be referred to as a half-etched region.

Figure 11:
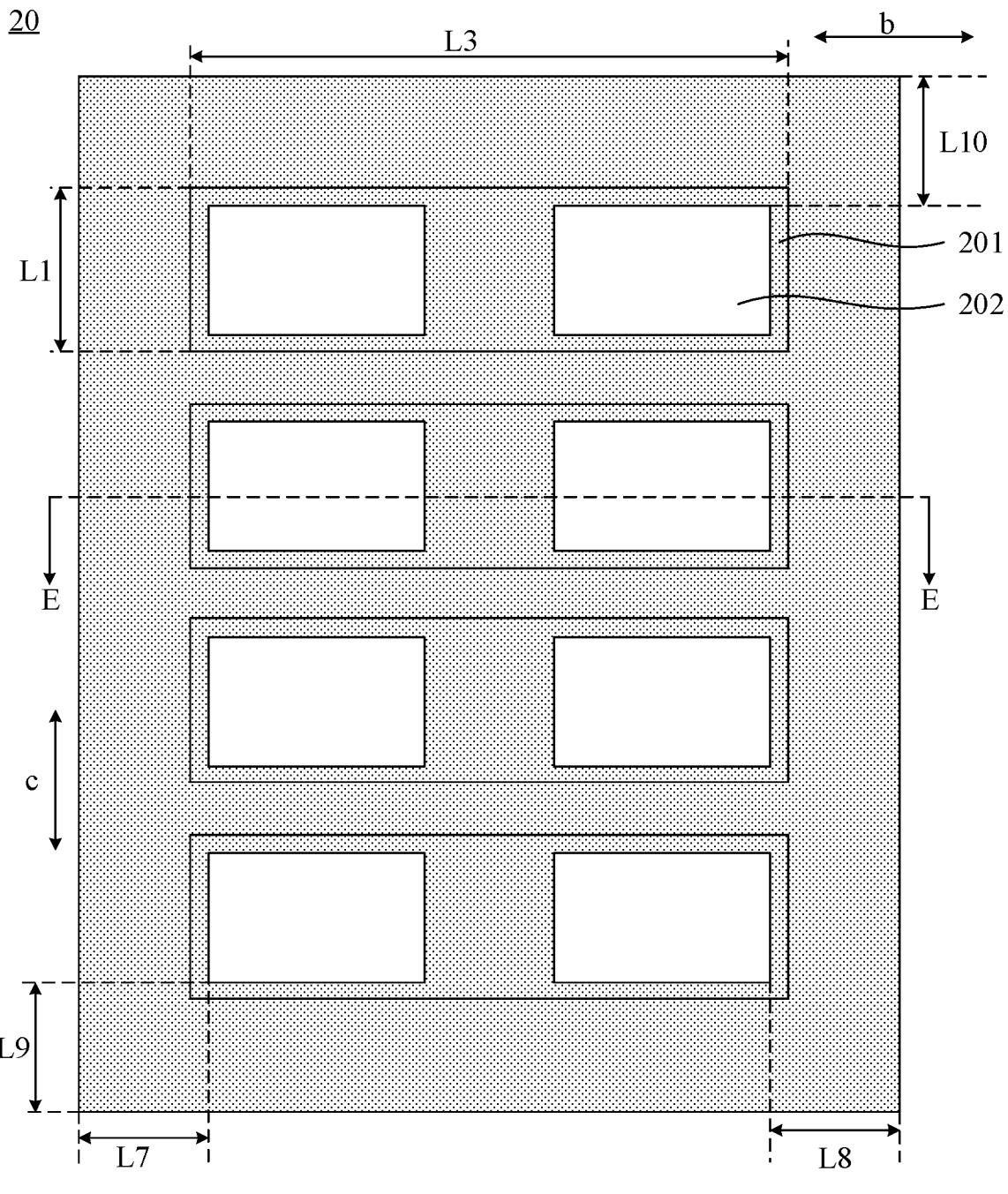
FIG. 11 is a top view of a mask body according to an embodiment of the present disclosure.

FIG. 11 is a top view of a mask body according to an embodiment of the present disclosure. Referring to FIG. 11, each groove 201 is provided with two hollowed-out structures 202.

In the embodiments of the present disclosure, one groove 201 is provided with two hollowed-out structures 202, and one mask strip 30 covers two hollowed-out structures 202, which can improve the efficiency of mounting the mask strips 30.

As shown in FIG. 11, one mask strip 30 is mounted in one groove 201. In other implementations, two mask strips 30 may also be amounted in one groove 201, and one mask strip 30 covers one hollowed-out structure 202.

In other implementations, a plurality of hollowed-out structures 202 are provided in each groove 201, which is not limited in the present disclosure.

In an implementation of the embodiments of the present disclosure, the hollowed-out structure 202 has a rectangular opening area. The length of the rectangular opening area ranges from 150 mm to 160 mm and the width of the rectangular opening area ranges from 70 mm to 80 mm. The opening area refers to a portion, intersected with the first surface W, of the hollowed-out structure 202.

In the embodiments of the present disclosure, the hollowed-out structures 202 are arranged as rectangular hollowed-out structures to facilitate manufacture of the hollowed-out structures 202. The size of the rectangular opening area is limited such that the size of the opening area matches the size of the pixel region, thereby ensuring the accuracy of the manufactured pixel regions.

Exemplarily, the length of the rectangular opening area is 150 mm and the width of the rectangular opening area is 80 mm.

As shown in FIG. 11, hollowed-out structures 202 are arranged in an array on the mask body 20. In a first direction b, the distance L7 between a left boundary of the hollowed-out structure 202 disposed on the leftmost side of the mask body 20 and a left boundary of the mask body 20 ranges from 100 µm to 140 µm; and the distance L8 between a right boundary of the hollowed-out structure 202 disposed on the rightmost side of the mask body 20 and a right boundary of the mask body 20 ranges from 100 µm to 140 µm. In a second direction c, the distance L9 between a lower boundary of the hollowed-out structure 202 disposed on the lowermost side of the mask body 20 and a lower boundary of the mask body 20 ranges from 100 µm to 140 µm; and the distance L10 between an upper boundary of the hollowed-out structure 202 disposed on the uppermost side of the mask body 20 and an upper boundary of the mask body 20 ranges from 100 µm to 140 µm. The first direction b is a length direction of the mask strip 30, and the second direction c is the width direction of the mask strip 30.

In this implementation, the distance between the boundary of the hollowed-out structure 202 and the boundary of the mask body 20 is limited to ensure that the hollowed-out structure 202 is disposed in a middle area of the mask body 20, for the convenience of subsequent evaporation.

Exemplarily, L7 is 120 µm, L8 is 120 µm, L9 is 120 µm, and L10 is 120 µm.

Figure 12:
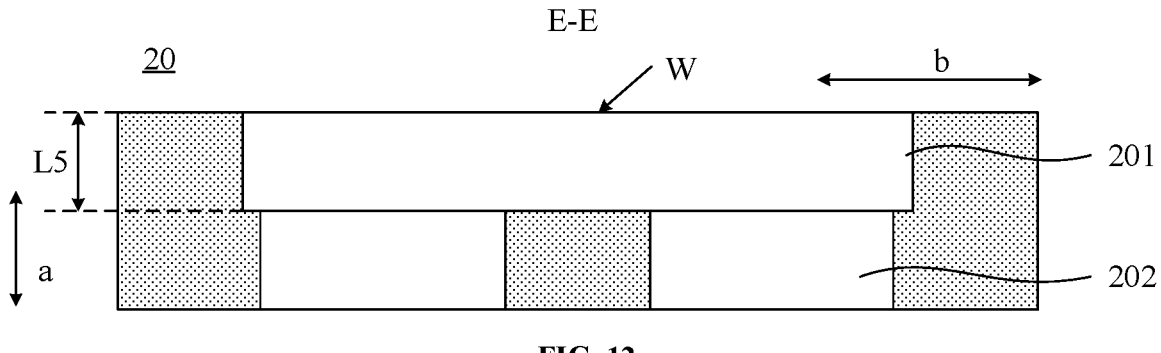
FIG. 12 is a schematic sectional view along the line E-E in FIG. 11.

FIG. 12 is a schematic sectional view along the line E-E in FIG. 11. Referring to FIG. 12, two hollowed-out structures 202 are provided in one groove.

Figure 13:
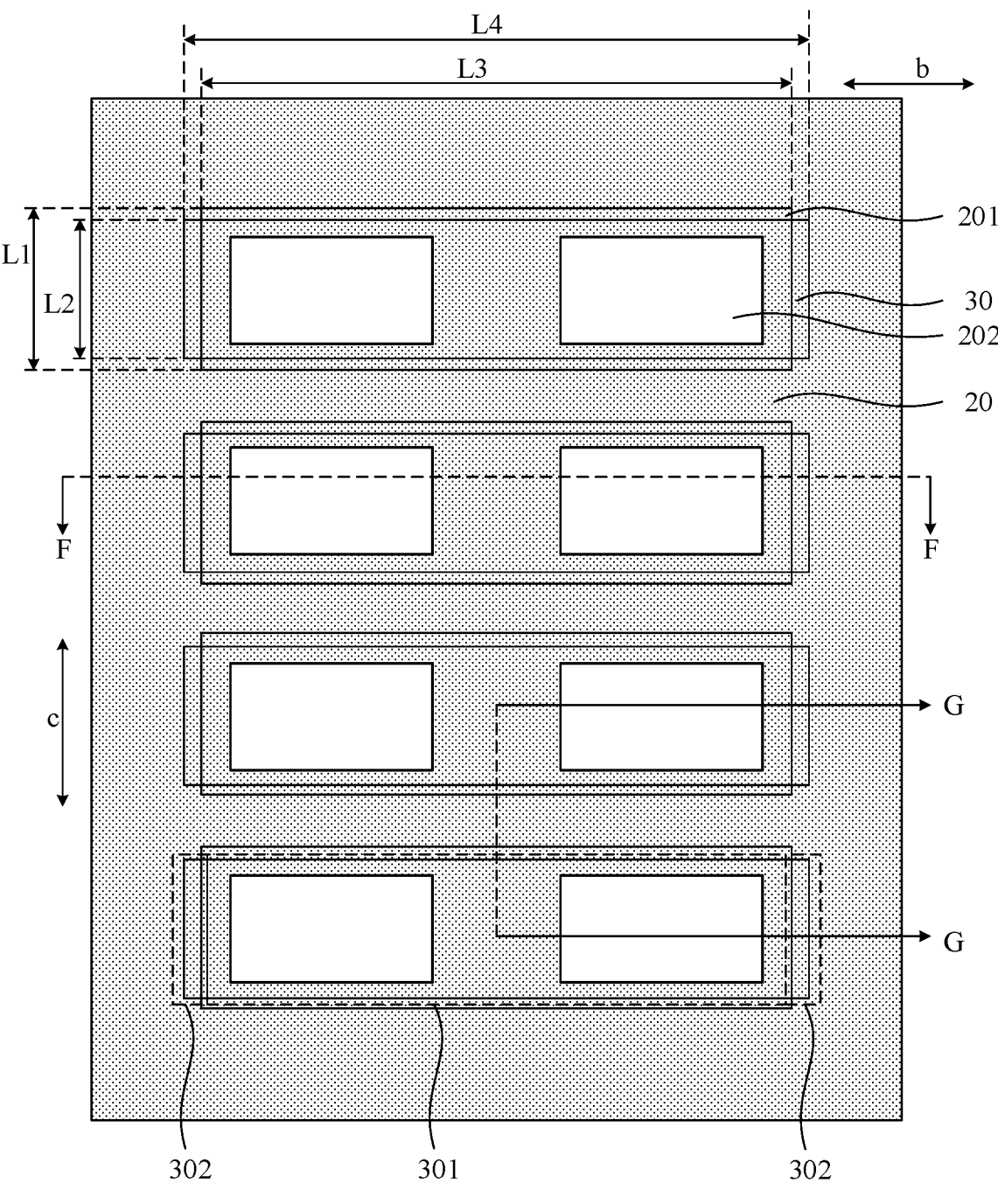
FIG. 13 is a top view of a mask according to an embodiment of the present disclosure.

FIG. 13 is a top view of a mask according to an embodiment of the present disclosure. FIG. 13 is a top view after the mask strips are mounted on the mask body shown in FIG. 11. Referring to FIG. 13, two hollowed-out structures 202 are provided in each groove 201.

Figure 14:
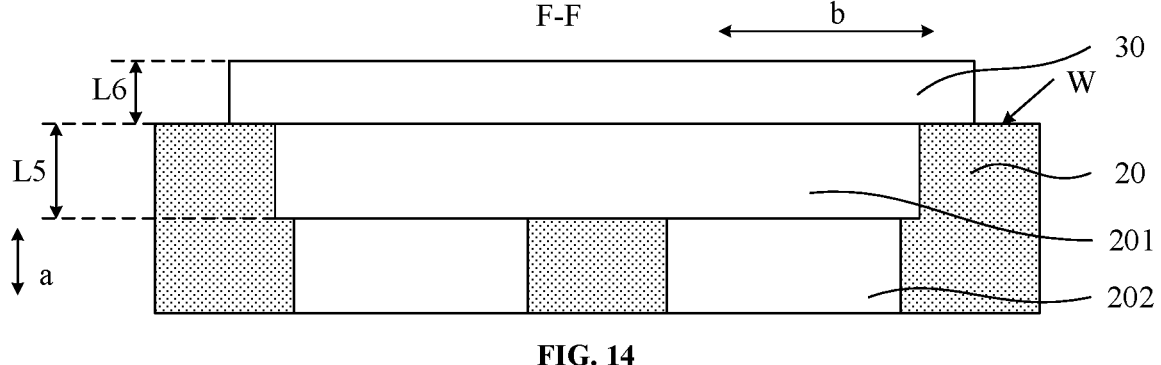
FIG. 14 is a schematic sectional view along the line F-F in FIG. 13.

FIG. 14 is a schematic sectional view along the line F-F in FIG. 13. Referring to FIG. 14, the mask strip 30 covers two hollowed-out structures 202. In this case, the pattern region 301 of the mask strip 30 corresponds to two hollowed-out structures 202.

Figure 15:
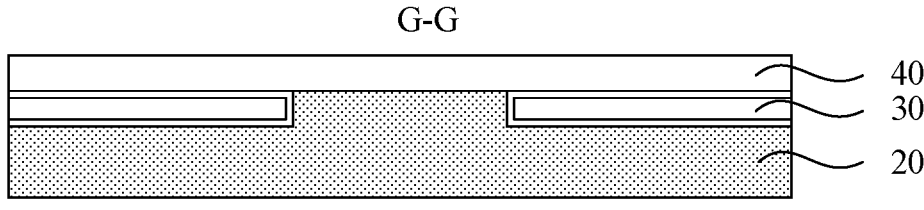
FIG. 15 is a schematic sectional view after a substrate and a mask strip are attached to each other according to an embodiment of the present disclosure.

FIG. 15 is a schematic sectional view after a substrate and the mask strips are attached to each other according to an embodiment of the present disclosure. FIG. 15 is a schematic sectional view of along the line G-G in FIG. 3 after the mask strips and the substrate are attached to each other. Referring to FIG. 15, in the embodiments of the present disclosure, after the mask strips 30 are mounted on the mask body 20, the substrate 40 squeezes the mask strips 30, so that the surface of the middle portion of the mask strip 30 is lower than the surface of the mask body 20, and the substrate 40 may not be in contact with the middle portion of the mask strip 30, thereby avoiding friction between the substrate 40 and the middle portion of the mask strip 30. In addition, the mask strips 30 may not move, and thus the boundaries of the mask strips 30 may not scrape the materials from the manufactured film layer. Therefore, no PS foreign matter is formed. Moreover, color mixing does not occur in the pixel regions, and the product yield is ensured.

In an implementation of the embodiments of the present disclosure, the mask body 20 is an iron-nickel alloy mask body.

In the embodiments, the iron-nickel alloy has a small expansion coefficient, the iron-nickel alloy mask body formed of the iron-nickel alloy is not easily deformed, so that the hollowed-out structures 202 on the mask body 20 are not easily deformed, thereby reducing the effect on positions of the hollowed-out structures 202 and ensuring the accuracy of evaporation.

In other implementations, the mask body 20 may be a stainless steel mask body.

In the embodiments of the present disclosure, the mask body 20 may be referred to as a full mask.

In the masks shown in FIG. 9, FIG. 10, FIG. 13 and FIG. 14, the length L3 of the groove 201 is smaller than the length L4 of the mask strip 30, that is, the mask strips 30 are welded to the first surface W of the mask body 20. In other implementations, the length L3 of the groove 201 may be greater than or equal to the length L4 of the mask strip 30. In this case, the mask strips 30 are mounted on the steps formed by the grooves 201 and the hollowed-out structures 202.

Figures 16, 17:
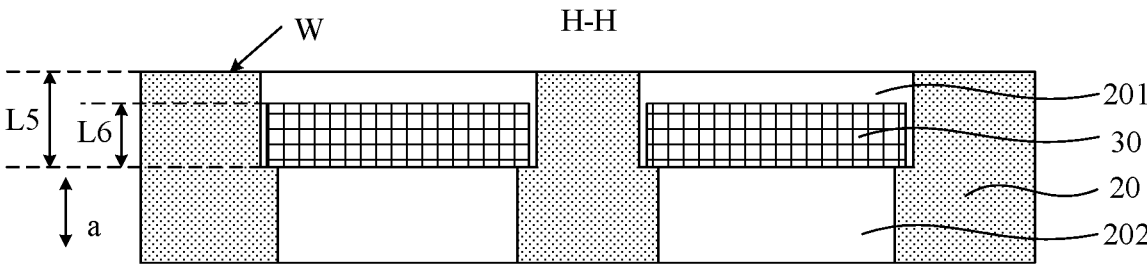
FIG. 16 is a top view of a mask according to an embodiment of the present disclosure.
FIG. 17 is a schematic sectional view along the line H-H in FIG. 16.

FIG. 16 is a top view of a mask according to an embodiment of the present disclosure. FIG. 17 is a schematic sectional view along the line H-H in FIG. 16. Referring to FIGS. 16 and 17, the length L3 of the groove 201 is greater than the length L4 of the mask strip 30, and the mask strip 30 is mounted in the groove 201 (the welding regions 302 of the mask strips 30 are welded within the groove 201). In this case, the height of the entire mask strip 30 is lower than the height of the mask body 20. In the process of evaporation, the substrate 40 is not in contact with the mask strip 30 and the mask strip 30 is prevented from moving, thereby ensuring the accuracy of the pixels formed by evaporation.

In the mask body 20 shown in FIGS. 7 to 17, the grooves 201 are closed annular grooves. In other implementations, the grooves 201 may also not be closed grooves.

Figure 18:
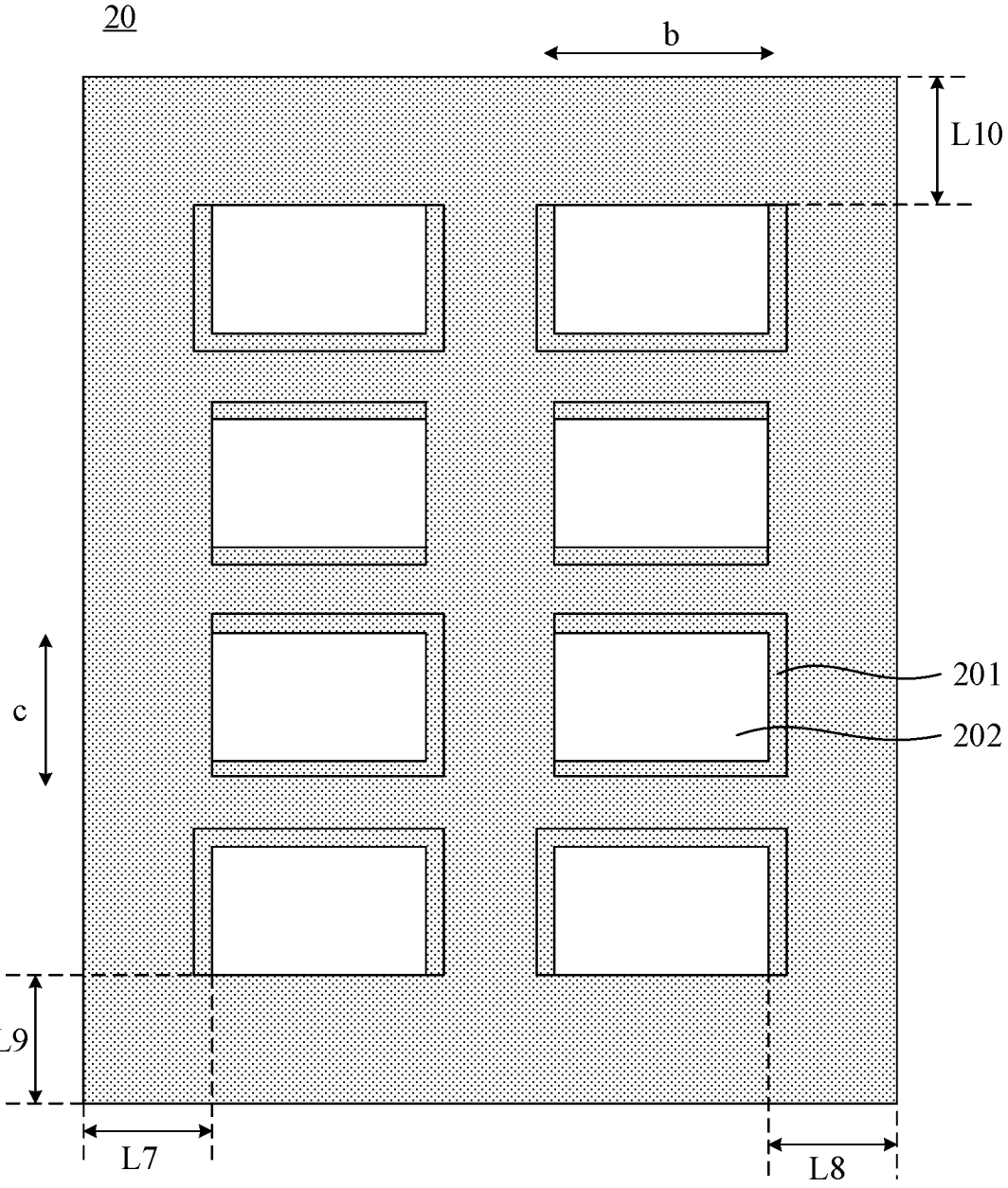
FIG. 18 is a top view of a mask body according to an embodiment of the present disclosure.
Figure 19:
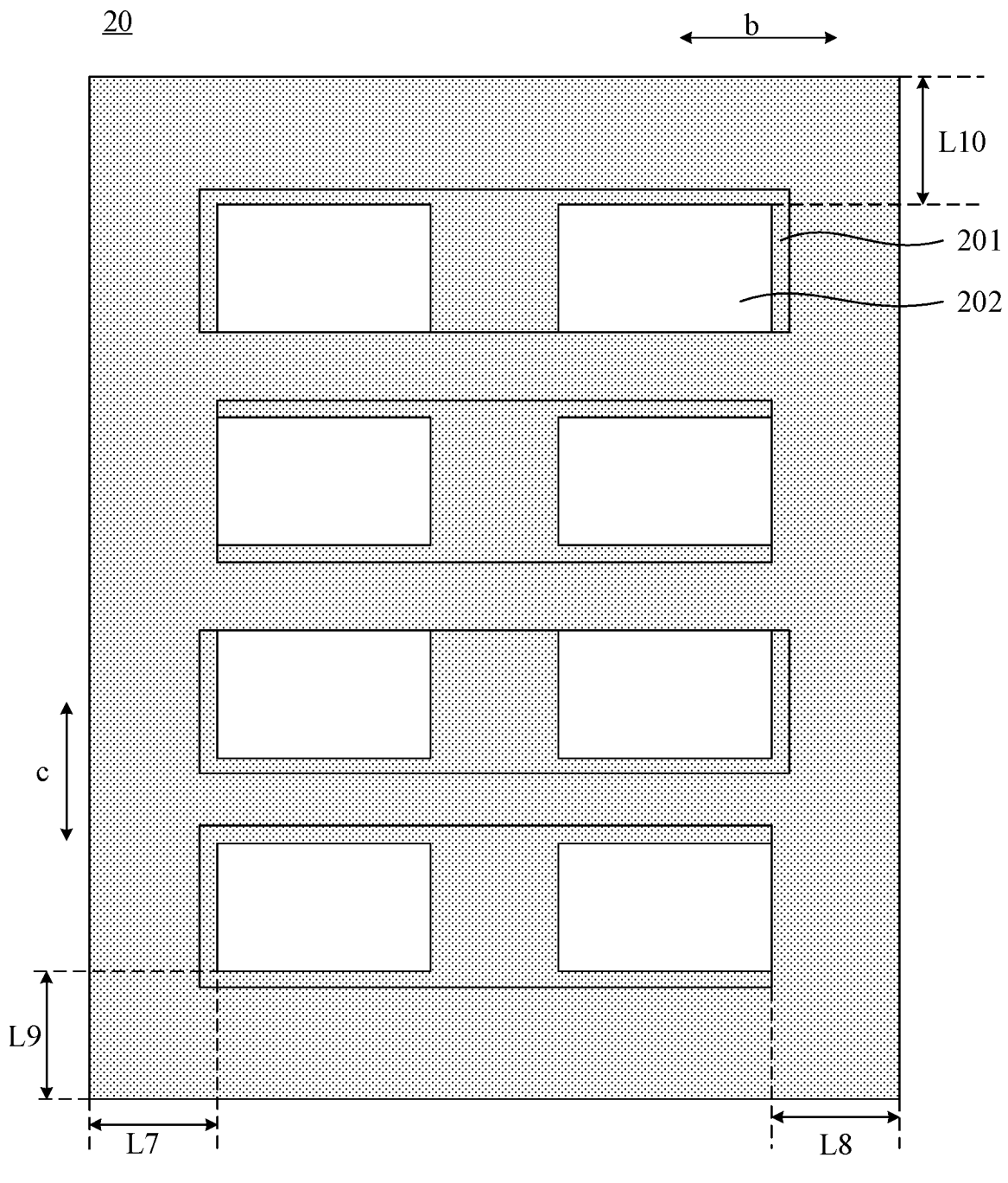
FIG. 19 is a top view of a mask body according to an embodiment of the present disclosure.

FIGS. 18 and 19 are top views of a mask body according to an embodiment of the present disclosure. Referring to FIGS. 18 and 19, the grooves 201 are not closed, and the groove 201 only has 2 or 3 edges, as long as it's ensured that the groove 201 can accommodate the middle portion of the mask strip 30.

Figure 20:
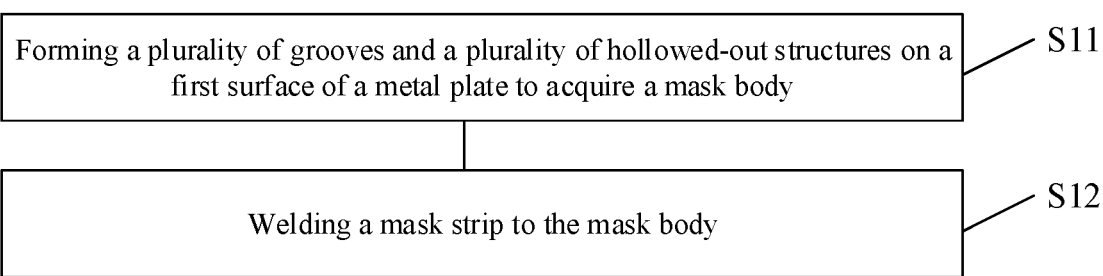
FIG. 20 is a flowchart of a method for manufacturing a mask according to an embodiment of the present disclosure.

FIG. 20 is a flowchart of a method for manufacturing a mask according to an embodiment of the present disclosure. Referring to FIG. 20, the method includes the following steps.

In step S11, a plurality of grooves and a plurality of hollowed-out structures are formed on a first surface of a metal plate to acquire a mask body. Each groove is provided with a hollowed-out structure, and a pattern region of a mask strip is within an orthographic projection of the groove on the first surface.

There are two main implementations for step S11, which are introduced below.

Figure 21:
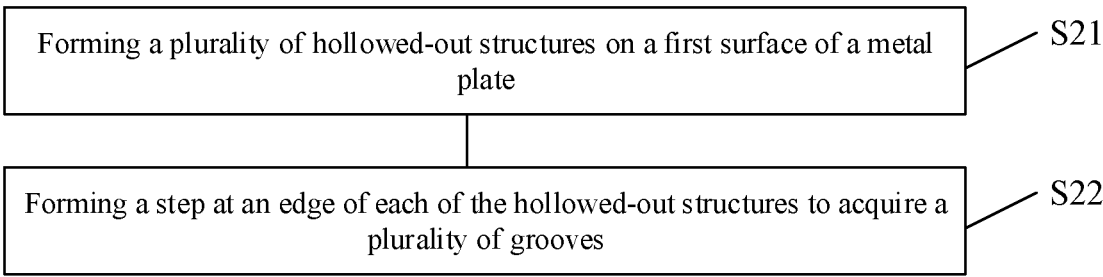
FIG. 21 is a flowchart of a method for manufacturing a mask according to an embodiment of the present disclosure.

FIG. 21 is a flowchart of a method for manufacturing a mask according to an embodiment of the present disclosure. Referring to FIG. 21, the method includes the following steps.

In step S21, a plurality of hollowed-out structures are formed on a first surface of a metal plate.

Figure 22:
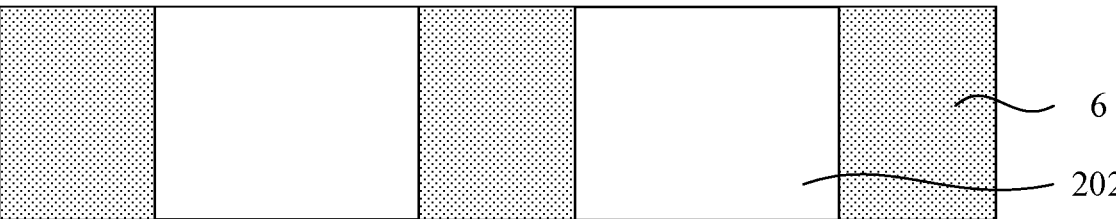
FIG. 22 is a diagram of a process for manufacturing a mask according to an embodiment of the present disclosure.
Figure 23:
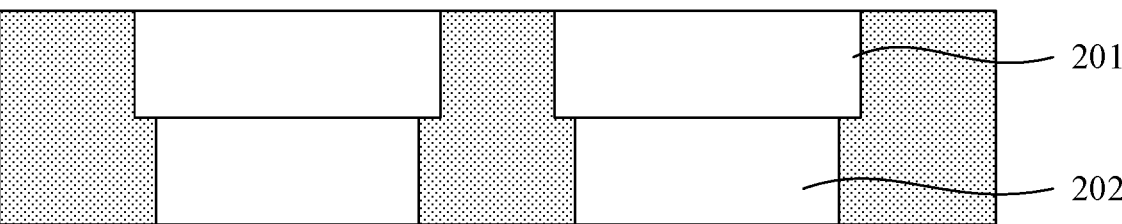
FIG. 23 is a diagram of a process for manufacturing a mask according to an embodiment of the present disclosure.

FIGS. 22 and 23 are diagrams of a process for manufacturing a mask according to embodiments of the present disclosure. Referring to FIG. 22, a plurality of hollowed-out structures 202 are formed on a metal plate 6, and the hollowed-out structures 202 are disposed in a middle portion of the metal plate 6.

In an implementation of the embodiments of the present disclosure, the metal plate 6 is an iron-nickel alloy metal plate or a stainless steel metal plate.

Exemplarily, the plurality of hollowed-out structures 202 may be formed on the metal plate 6 by etching.

For example, a layer of photoresist is coated on the metal plate 6 first; next, the photoresist is shielded with a mask, irradiated with light and developed to remove the photoresist of the hollowed-out structures 202; next, the metal plate 6 is etched to acquire the hollowed-out structures 202; and then the photoresist on the metal plate 6 is removed.

In step S22, a step is formed at an edge of each of the hollowed-out structures to acquire a plurality of grooves.

Referring to FIG. 23, the step is formed at the edge of each of the hollowed-out structures 202 to form a plurality of grooves 201.

Optionally, in the embodiments of the present disclosure, the grooves 201 are rectangular grooves.

Optionally, in the embodiments of the present disclosure, the size of the mask strip 30 is determined, and then the size of the groove 201 is determined, so that the groove 201 is wider than the mask strip 30.

Exemplarily, the steps may be formed at the edges of the hollowed-out structures 202 by etching. An etching step for forming the grooves 201 is the same as step S21, and the difference lies in that an ordinary mask is used in etching for forming the hollowed-out structures, while a gray mask is used in etching for forming the grooves.

Figure 24:
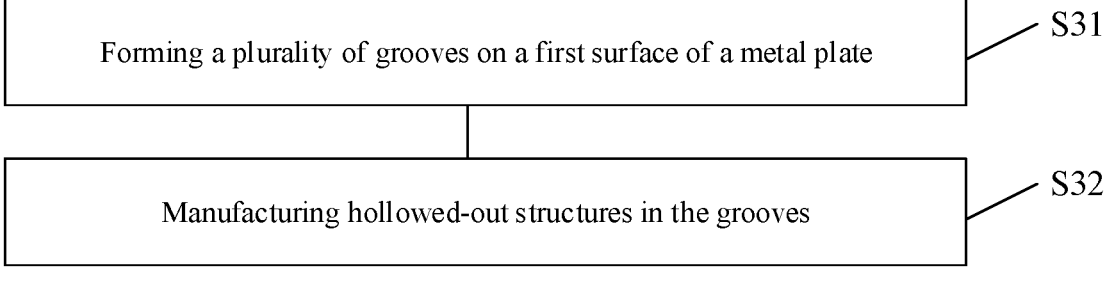
FIG. 24 is a flowchart of a method for manufacturing a mask according to an embodiment of the present disclosure.

FIG. 24 is a flowchart of a method for manufacturing a mask according to an embodiment of the present disclosure. Referring to FIG. 24, the method includes the following steps.

In step S31, a plurality of grooves are formed on a first surface of a metal plate.

Figure 25:
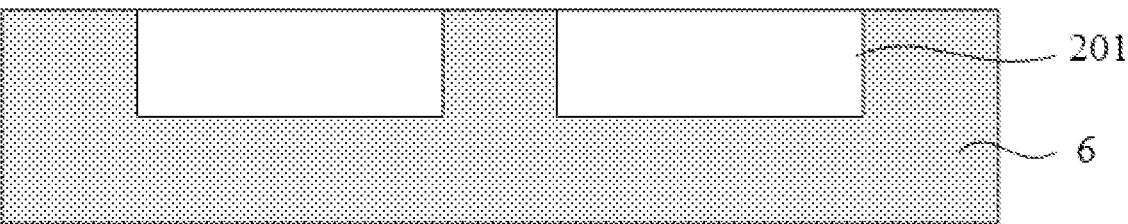
FIG. 25 is a diagram of a process for manufacturing a mask according to an embodiment of the present disclosure.

FIG. 25 is a diagram of a process for manufacturing a mask according to an embodiment of the present disclosure. Referring to FIG. 25, a plurality of grooves 201 are formed on the first surface of a metal plate 6.

Exemplarily, the plurality of grooves 201 may be formed on the first surface of the metal plate 6 by etching.

In step S32, hollowed-out structures are manufactured in the grooves.

After the hollowed-out structure 202 is manufactured in each of the grooves 201, the mask as shown in FIG. 23 is formed.

Exemplarily, the hollowed-out structure 202 may be manufactured in each of the grooves 201 by etching.

In the above manufacturing process, one hollowed-out structure 202 is provided in one groove 201. In other implementations, two or more hollowed-out structures 202 may be provided in one groove 201.

In step S12, the mask strip is welded to the mask body. The pattern region of the mask strip is within the orthographic projection of the groove on the first surface.

After the mask strips are welded to the mask body, the mask is acquired.

Exemplarily, during welding, the welding regions of the mask strip are welded to the first surface of the mask body.

Figure 26:
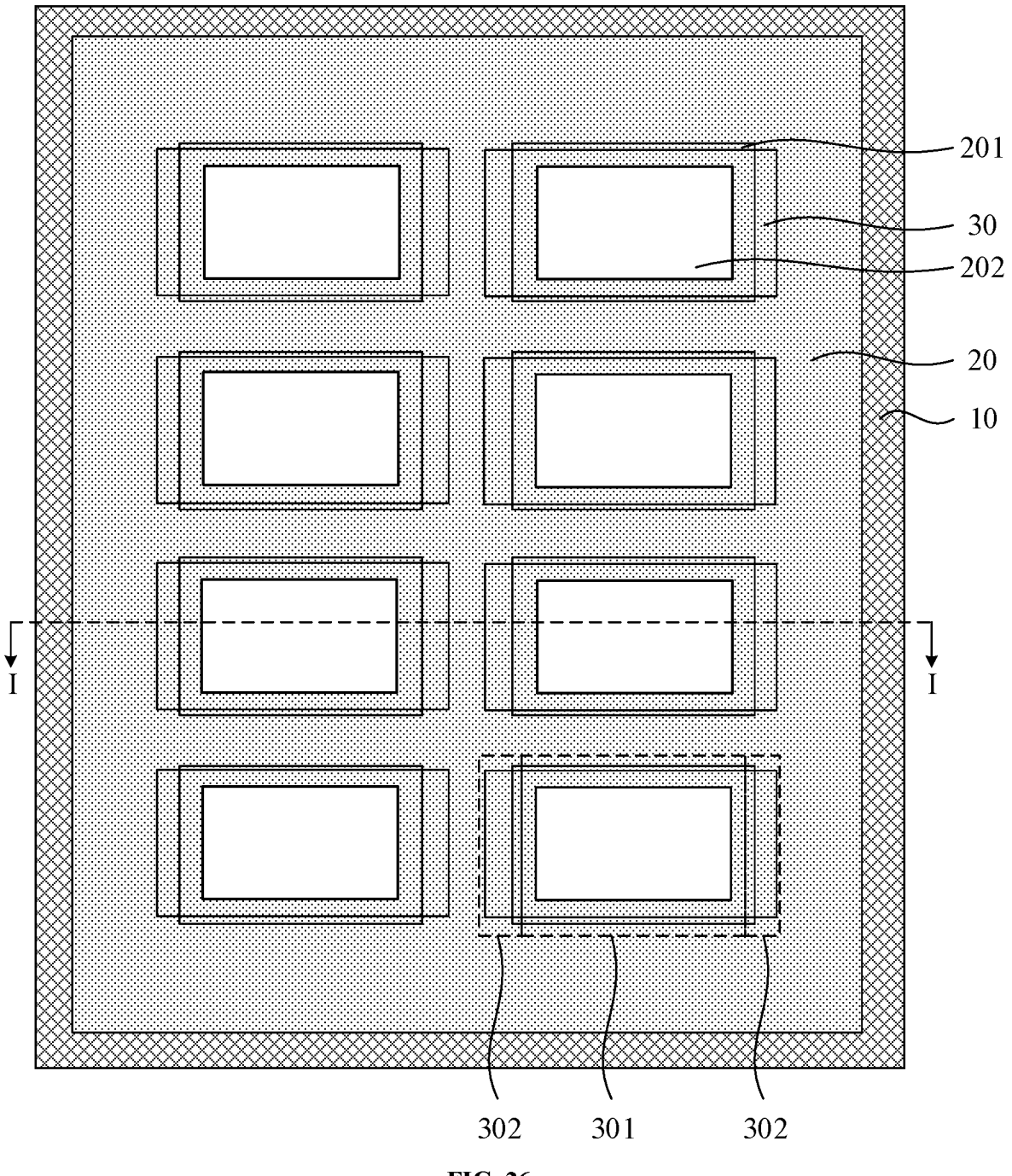
FIG. 26 is a top view of a mask structure according to an embodiment of the present disclosure.

FIG. 26 is a top view of a mask structure according to an embodiment of the present disclosure. Referring to FIG. 26, the mask structure includes a mask frame 10, a mask body 20, and mask strips 30.

Figure 27:
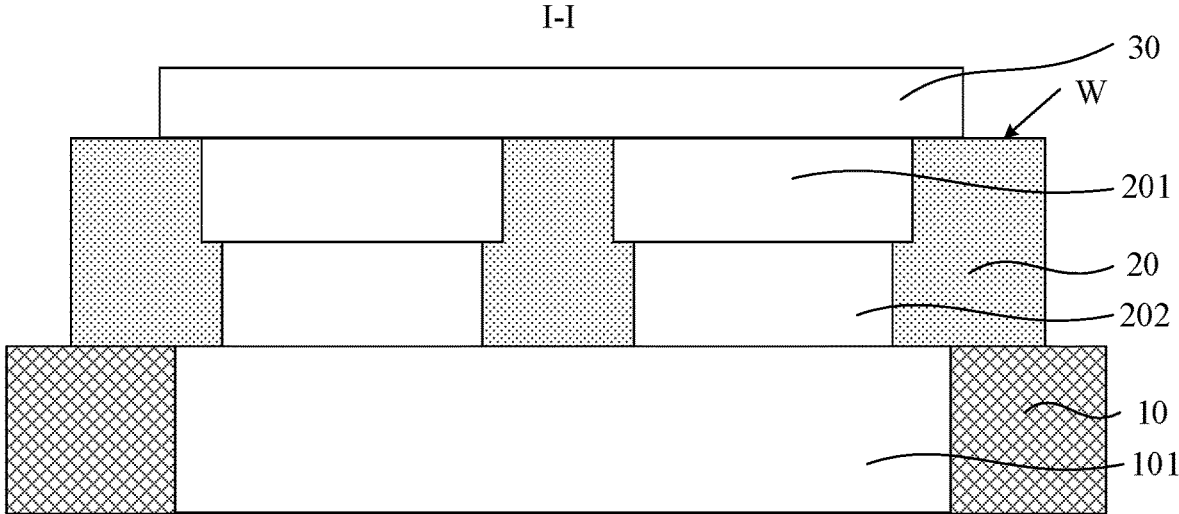
FIG. 27 is a schematic sectional view along the line I-I in FIG. 26.

FIG. 27 is a schematic sectional view along the line I-I in FIG. 26. Referring to FIG. 27, the mask frame 10 is provided with an opening 101, and the mask body 20 is disposed on the mask frame 10. The mask body 20 includes a plurality of grooves 201, and the plurality of grooves 201 are distributed at intervals on a first surface W of the mask body 20. The groove 201 is provided with a hollowed-out structure 202, and an opening area of the hollowed-out structure 202 is within an orthographic projection of the opening 101 on the first surface W. The mask strip 30 is disposed on the mask body 20, a pattern region 301 of the mask strip 30 is within an orthographic projection of the groove 201 on the first surface W, and the opening area of the hollowed-out structure 202 is within the pattern region 301 of the mask strip 30.

In this implementation, the grooves 201 are disposed on the mask body 20, and the pattern region 301 of the mask strip 30 is within the orthographic projection of the groove 201 on the first surface W, that is, the groove 201 is configured to accommodate the middle portion of the mask strip 30. In the process of attaching the substrate to the mask strip, when the substrate 40 is placed above the mask strip 30, the substrate 40 exerts, on the mask strip 30, a force towards the mask body 20, so that the middle portion of the mask strip 30 moves towards the inside of the groove 201, and the middle portion of the mask strip 30 is not in contact with the substrate 40, i.e., there is no friction force between the middle portion of the mask strip 30 and the substrate 40. In the process of lowering the substrate 40, since there is no friction force between the middle portion of the mask strip 30 and the substrate, the movement of the pattern region 301 of the mask strip 30 is reduced. Therefore, the bending degree of the mask strip 30 is reduced and the accuracy of the pixel regions formed by evaporation is improved.

In an implementation of the embodiments of the present disclosure, the mask is a metal mask, and the mask frame 10 is an iron-nickel alloy frame or a stainless steel frame. The mask frames formed of the iron-nickel alloy and stainless steel are not easily deformed, which can ensure the accuracy of evaporation.

In an implementation of the embodiments of the present disclosure, the material of the mask strips 30 is an iron-nickel alloy, and the mask strips formed of the iron-nickel alloy are not easily deformed, which can ensure the accuracy of evaporation.

Optionally, in the embodiments of the present disclosure, the mask body 20 is welded to the mask frame 10, and the mask strips 30 are welded to the mask body 20.

For the relationship between the size of the groove 201 and the size of the mask strip 30, reference may be made to the above descriptions of the mask, and details are not repeated herein.

The descriptions above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A mask, comprising:
a mask body, comprising a plurality of grooves, wherein the plurality of grooves are distributed at intervals on a first surface of the mask body, and a hollowed-out structure is provided in the plurality of grooves; and
a plurality of mask strips disposed on the mask body, wherein each of the plurality of mask strips is completely mounted in each of the plurality of grooves, an orthographic projection of each of the plurality of mask strips on the first surface is within an orthographic projection of each of the plurality of grooves on the first surface, a welding region of the mask strip is welded to the mask body within the groove, in a direction perpendicular to the first surface, a depth of each of the plurality of grooves is greater than a thickness of the mask strip, a substrate is disposed on the first surface of the mask body, and the mask strip is not in contact with the substrate.

2. The mask according to claim 1, wherein a width of the plurality of grooves is greater than a width of the mask strip.

3. The mask according to claim 2, wherein a difference value between the width of the plurality of grooves and the width of the mask strip ranges from 1 μm to 5 μm.

4. The mask according to claim 1, wherein a length of the plurality of grooves is smaller than a length of the mask strip.

5. The mask according to claim 4, wherein a difference value between the length of the plurality of grooves and the length of the mask strip ranges from 1 μm to 5 μm.

6. The mask according to claim 1, wherein a difference value between the depth of the plurality of grooves and the thickness of the mask strip ranges from 5 μm to 15 μm.

7. The mask according to claim 1, wherein an opening area of the hollowed-out structure is a rectangular opening area, a length of the rectangular opening area ranging from 150 mm to 160 mm and a width of the rectangular opening area ranging from 70 mm to 80 mm.

8. The mask according to claim 1, wherein one hollowed-out structure is provided in each of the plurality of grooves.

9. The mask according to claim 1, wherein two hollowed-out structures are provided in each of the plurality of grooves.

10. The mask according to claim 1, wherein the mask body is an iron-nickel alloy mask body or a stainless steel mask body.

11. A mask structure, comprising:
a mask frame, provided with an opening; and wherein the mask comprises:
a mask body, comprising a plurality of grooves, wherein the plurality of grooves are distributed at intervals on a first surface of the mask body, and a hollowed-out structure is provided in the plurality of grooves;
a plurality of mask strips disposed on the mask body, wherein each of the plurality of mask strips is completely mounted in each of the plurality of grooves, an orthographic projection of each of the plurality of mask strips on the first surface is within an orthographic projection of each of the plurality of grooves on the first surface, a welding region of the mask strip is welded to the mask body within the groove, in a direction perpendicular to the first surface, a depth of each of the plurality of grooves is greater than a thickness of the mask strip, and a substrate is disposed on the first surface of the mask body, and the mask strip is not in contact with the substrate; and
the mask is disposed on the mask frame.

12. A method for manufacturing a mask, comprising:
forming a plurality of grooves and a plurality of hollowed-out structures on a first surface of a metal plate to acquire a mask body, wherein the hollowed-out structure is provided in each of the plurality of grooves; and
welding a plurality of mask strips to the mask body, wherein each of the plurality of mask strips is completely mounted in each of the plurality of grooves, an orthographic projection of each of the plurality of mask strips on the first surface is within an orthographic projection of each of the plurality of grooves on the first surface, a welding region of the mask strip is welded to the mask body within the groove, in a direction perpendicular to the first surface, a depth of each of the plurality of grooves is greater than a thickness of the mask strip, a substrate is disposed on the first surface of the mask body, and the mask strip is not in contact with the substrate.

13. The method according to claim 12, wherein forming the plurality of grooves and the plurality of hollowed-out structures on the first surface of the metal plate comprises:
forming the plurality of hollowed-out structures on the first surface of the metal plate; and
forming a step at an edge of each of the hollowed-out structures to acquire the plurality of grooves.

14. The method according to claim 12, wherein forming the plurality of grooves and the plurality of hollowed-out structures on the first surface of the metal plate comprises:
forming the plurality of grooves on the first surface of the metal plate; and
manufacturing the hollowed-out structures in the plurality of grooves.

15. The mask structure according to claim 11, wherein a width of the plurality of grooves is greater than a width of the mask strip.

16. The mask structure according to claim 11, wherein a length of the plurality of grooves is smaller than a length of the mask strip.

17. The mask structure according to claim 11, wherein one hollowed-out structure is provided in each of the plurality of grooves.

18. The mask structure according to claim 11, wherein two hollowed-out structures are provided in each of the plurality of grooves.

* * * * *